(12) United States Patent
Fox et al.

(10) Patent No.: US 7,990,768 B2
(45) Date of Patent: *Aug. 2, 2011

(54) SETTING MEMORY CONTROLLER DRIVER TO MEMORY DEVICE TERMINATION VALUE IN A COMMUNICATION BUS

(75) Inventors: Benjamin A Fox, Rochester, MN (US);
William P Hovis, Rochester, MN (US);
Thomas W Liang, Rochester, MN (US);
Paul Rudrud, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 198 days.

This patent is subject to a terminal disclaimer.

(21) Appl. No.: 12/361,577

(22) Filed: Jan. 29, 2009

(65) Prior Publication Data
US 2010/0188916 A1 Jul. 29, 2010

(51) Int. Cl.
*G11C 16/04* (2006.01)
(52) U.S. Cl. ............. 365/185.09; 365/189.09; 365/198; 365/230.06
(58) Field of Classification Search ............. 365/185.09, 365/189.09, 230.06, 198
See application file for complete search history.

(56) References Cited

U.S. PATENT DOCUMENTS

| 6,330,194 | B1 | 12/2001 | Thomann et al. |
| 6,762,614 | B2 | 7/2004 | Rearick et al. |
| 7,362,622 | B2 * | 4/2008 | Braun et al. ............. 365/189.09 |
| 7,514,954 | B2 | 4/2009 | Kim et al. |
| 7,515,487 | B2 | 4/2009 | Seo et al. |
| 7,593,272 | B2 * | 9/2009 | Doyle et al. ............. 365/189.09 |
| 2010/0188908 | A1 * | 7/2010 | Fox et al. ............. 365/189.011 |
| 2010/0188917 | A1 * | 7/2010 | Fox et al. ............. 365/226 |
| 2010/0188919 | A1 * | 7/2010 | Fox et al. ............. 365/226 |
| 2010/0192000 | A1 * | 7/2010 | Fox et al. ............. 713/340 |

OTHER PUBLICATIONS

JEDEC Standard; POD18—1.8 V Pseudo Open Drain I/O; JESD8-19 Datasheet [online]. JEDEC Solid State Technology Association, 2006 [retrieved on Mar. 12, 2008]. Retrieved from the Internet: <URL: http://www.jedec.org/download/search/JESD8-19.pdfl>.
Notice of Allowance issued for U.S. Appl. No. 12/361,976, mail date Jul. 30, 2010, 7 pp.

* cited by examiner

*Primary Examiner* — Pho M Luu
(74) *Attorney, Agent, or Firm* — Toler Law Group

(57) ABSTRACT

A method and system are provided for coupling a DRAM and a memory controller during driver training to reduce mismatches by controlling impedances within the system environment. A memory device initializes a bit level voltage on a data net. A driver impedance in a driving element in the controller is modified to yield improvements in timing margins.

20 Claims, 5 Drawing Sheets

SETTING MEMORY CONTROLLER DRIVER TO MEMORY DEVICE TERMINATION VALUE IN A COMMUNICATION BUS

RELATED APPLICATIONS

The present application relates to co-pending U.S. patent applications, entitled "Setting Controller VREF in a Memory Controller and Memory Device Interface in a Communication Bus" (Ser. No. 12/361,719, "Setting Controller Termination in a Memory Controller and Memory Device Interface in a Communication Bus" (Ser. No. 12/361,836, "Calibration of Memory Driver with Offset in a Memory Controller and Memory Device Interface in a Communication Bus" (Pat. No. 7,848,175, "Setting Memory Device Vref in a Memory Controller and memory Device Interface in a Communication Bus" (Ser. No. 12/361,592, and "Setting Memory Device Termination in a Memory Device and Memory Controller Interface in a Communications Bus" (Ser. No. 12/361,602, by the present inventors, Paul W. Rudrud, Thomas W. Liang, Benjamin A. Fox, and William P. Hovis. The co-pending applications are filed concurrently herewith, and are incorporated by reference in their entireties.

FIELD OF THE INVENTION

This invention relates to a system and method in which a memory device, such as a DRAM, and a memory controller are coupled during memory driver training to reduce mismatches by controlling impedance within the system environment. Embodiments of the invention further relate to coupling components on a shared electrical bus through driver adjustment during training as necessary to remove offset issues.

BACKGROUND OF THE INVENTION

In an electrical communication bus in which a memory controller is coupled with a memory device such as a GDDR3 DRAM memory, the DRAMs are designed to train their drive impedance and termination values against a reference resistor arrangement. However, process variations and resolution may cause variations in the final DRAM training values. The variations may occur within a memory controller coupled to the DRAM if it trains in a similar manner, thereby causing a mismatch in DRAM and controller impedances.

Such mismatches may cause timing offsets due to the reference voltages not being properly aligned to the resulting data eye. The problem may specifically occur in a GDDR3 interface for a memory controller to a GDDR3 memory device. However, the problem also occurs in a number of other system and subsystem electrical communication buses resulting in reduced timing margins.

Accordingly, what is needed is an arrangement which couples a memory device and its memory controller during memory driver training to reduce mismatches through calibration of a memory controller with a memory device driver.

SUMMARY OF THE INVENTION

The present invention provides for a memory controller and a memory device, typically a DRAM memory device, and more particularly, a GDDR3 DRAM memory device to be coupled during driver training to reduce mismatches by controlling the termination impedance on the driving element in the memory controller to yield improvements in timing margins. More specifically, coupling the components on a shared electrical bus through termination impedance adjustment with the training necessary dramatically removes known offset issues.

An aspect of the invention provides a method of setting the drive impedance of a memory controller driver in an electrical communication bus having the memory controller driver connected to a memory device. The memory device may be connected in an electrical communication bus or data net with a corresponding memory controller during training of the drive impedance of the driver of the memory controller. The driver in the memory controller drives or sets a 0 bit level voltage on the communication bus based on a first initializing value set by the memory controller. A first voltage based on the 0 bit level may be set on a first test path of the memory controller. The first voltage on the test path may be adjusted and monitored, and when the voltage on the test path switches its value to a 1 bit level, the drive impedance of the controller driver on the set may be based on the adjusted voltage. The adjusted voltage may be based on the switched first voltage on the first test path.

In a more specific aspect, there may be two test paths provided in the memory controller and both a 0 bit level and a 1 bit level voltage corresponding to Vlow and Vhigh values respectively. These paths may set a high and low driver impedance for the controller driver.

Another aspect of the invention includes a coupled memory controller and memory device in an electrical communication bus. A first connection that comprises a data net of the communication bus may be established between a memory interface of the memory controller to the memory device. A driver of the memory controller may be connected to a termination of the memory device for reading an initialized 0 bit level voltage on the data net. A test path in the memory controller may be connected for having the initial 0 bit level voltage from the data net applied thereto. The test path may be configured for causing a voltage on the test path to change to cause the 0 bit level voltage to change. A detector detects the change in the voltage connected to the test path. When the 0 bit level voltage changes to a 1 bit level, an impedance setting module sets the termination impedance for the memory controller driver based on the changed voltage.

In a more specific aspect, there is provided both a low voltage (Vlow) test path and a high voltage (Vhigh) test path. This provides for both a 0 bit level and a 1 bit level voltage that may be set based on adjustments of the voltage on the test paths, to thereby calibrate the memory controller with the memory device.

These and other advantages and features that characterize the invention are set forth in the claims annexed hereto and forming a further part hereof. However, for a better understanding of the invention, and of the advantages and objectives attained through its use, reference should be made to the drawings, and to the accompanying descriptive matter, in which there are described exemplary embodiments of the invention.

DETAILED DESCRIPTION OF THE INVENTION

In one aspect, embodiments consistent with the invention may capitalize on the ability to couple a memory device such as a DRAM and a memory controller during driver training to reduce mismatches by controlling the driver impedance on the driver in a controller. This may yield improvements in timing margins. In more general terms, coupling the components on a shared electrical bus through adjustment of the driver impedance during training removes known offset issues. Further, while embodiments of the invention are described specifically for a GDDR3 interface from a memory controller to a GDDR3 memory device, the system and method described may be applied to any number of system and sub-system electrical communication buses. Optionally, the speed at which the interface operates may be improved as a result of employing the system and method described.

Figure 1:
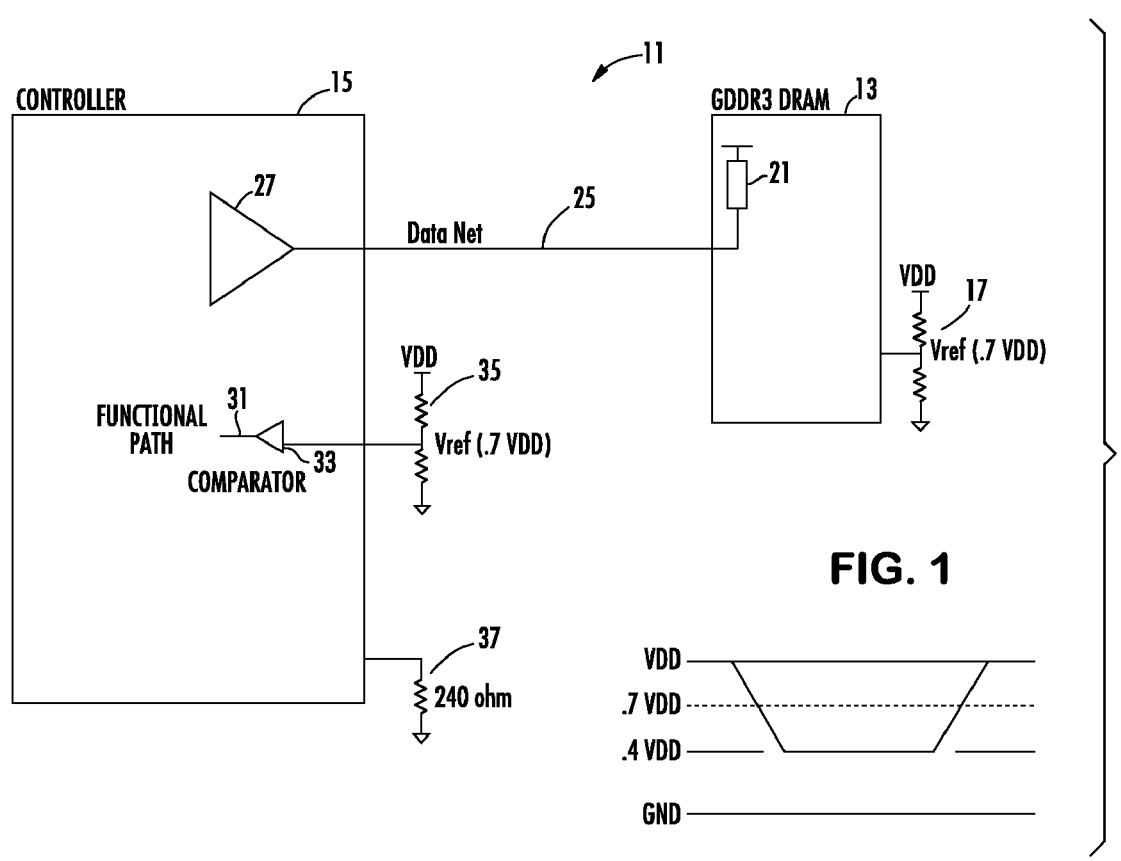
FIG. 1 is a schematic diagram illustrating a particular prior art interface in an electrical communication bus between a memory controller and a memory device, such as a GDDR3 DRAM memory device.

Turning more particularly to the drawings, FIG. 1 shows a typical GDDR3 interface. In the system 11, a memory controller 15 may be connected through a data net or communication bus 25 to a memory device 13, typically a GDDR3 DRAM. The data net 25 also connects to a functional path 31 in the memory controller 15. The functional path 31 includes a comparator 33 and may also be connected to a driver 27. A predetermined reference voltage for the controller 15 may typically be provided through a voltage divider pair of resistors 35. A separate resistor connection 37 may be provided in a conventional manner. The memory device 13 also includes a termination device 21. A predetermined reference voltage may be provided through a pair of resistors 17.

Figure 2:
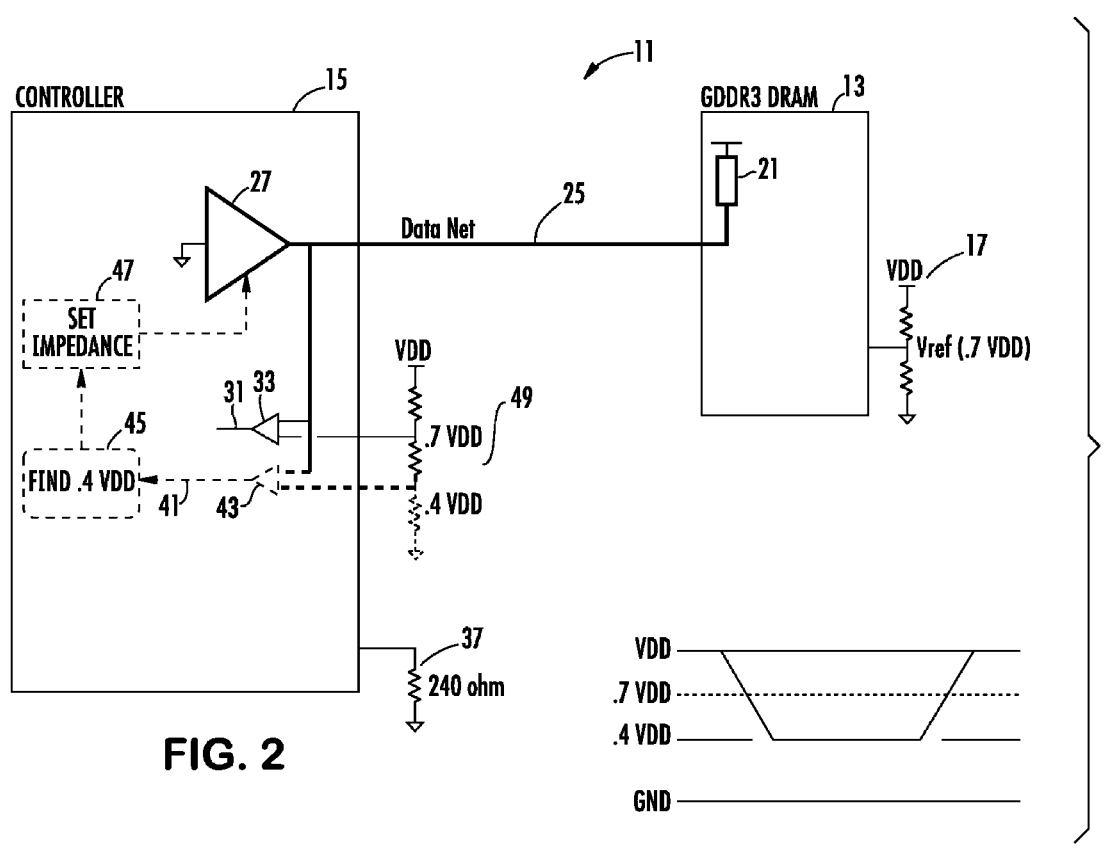
FIG. 2 is a schematic diagram of one embodiment of the invention for coupling a memory device and memory controller during driver training to reduce mismatches.

In one embodiment, the invention is generally shown by the system 11 illustrated in FIG. 2. The memory device 13 includes a termination device 21, as well as other components similar to those shown in FIG. 1. The memory device 13 receives a 0 bit level voltage on the data net 25. The impedance of driver 27 on the memory controller may be modified so that the predetermined reference voltage is at the vertical center of the eyes in order to obtain the maximum timing margin. By coupling the controller 15 and memory device 13 during training, the controller driver 27 impedance may be set to a value that is optimal for the memory device 13 termination impedance.

In order to achieve this setting, the voltage at the controller 15 output may be monitored. The controller driver 27 strength may be incremented until a change may be seen on a test path 41 having a comparator 43 connected thereto, and to resistor arrangement 49, and providing an output to detector 45. When the predetermined voltage of "0" level is achieved (i.e., a switch from a 0 bit level to a 1 bit level), an impedance setting device 47 sets the driver impedance for the controller 15. More specifically, the controller 15 may be programmed to adjust the voltage on the test path 41 to result in the predetermined level voltage.

Figure 4:
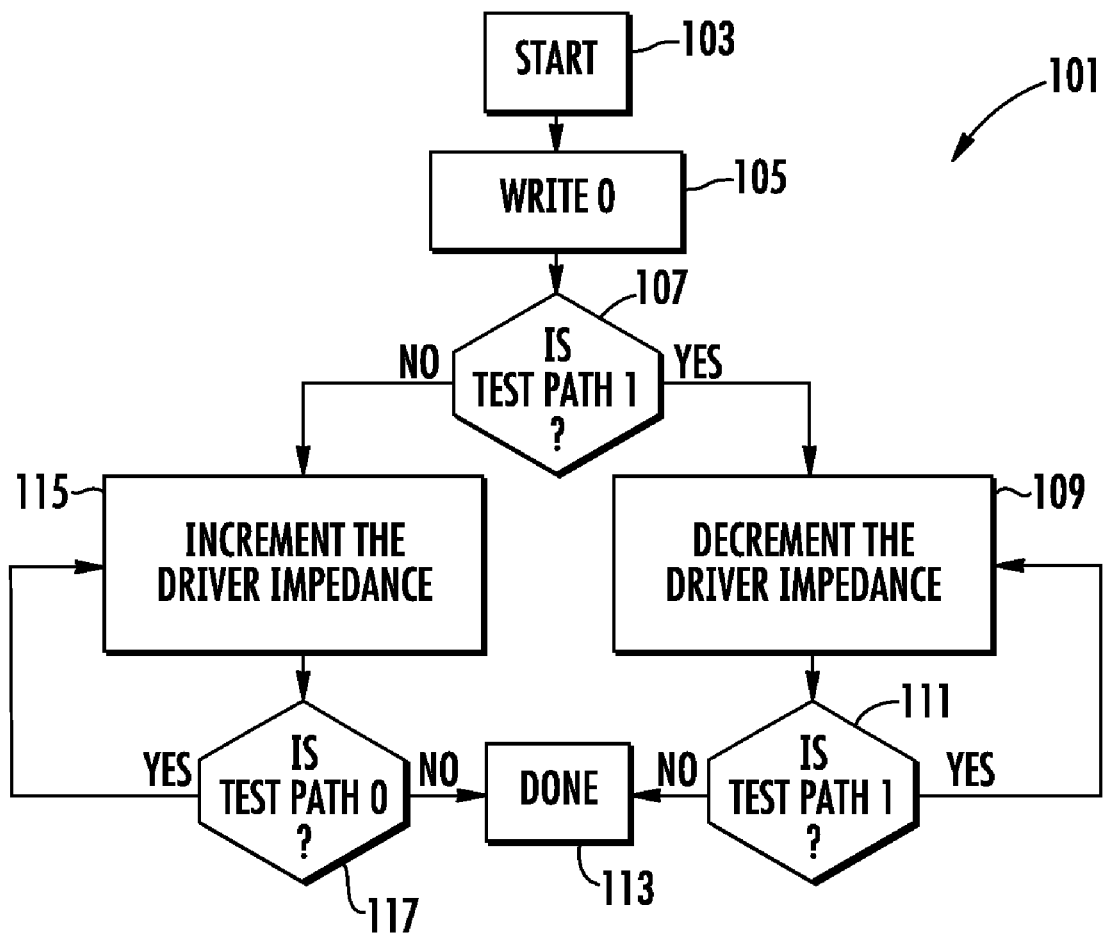
FIG. 4 is a flow diagram illustrating the operation during matching of the memory controller and the memory device of FIG. 2.

Referring to FIG. 4, the operation of the embodiment of FIG. 2 is better illustrated by flow chart 101. The process initiates at step 103, and a 0 bit level voltage may be written at step 105 on to the data net. It is determined if the test path voltage is at a 1 bit level at step 107. If so, the driver impedance may be decremented at step 109. A further check may be made of the voltage level on the test path and if it is still at a 1 bit level, decrementing of the driver impedance continues until it is no longer at a 1 bit level at step 109. The process then terminates at step 113. If the test path is not at a 1 bit level, the driver impedance may be incremented at step 115. The test path may be again tested at step 117 and the driver impedance continues to be incremented until the test path value is no longer at a 0 bit level. The process then terminates at step 113.

Figure 3:
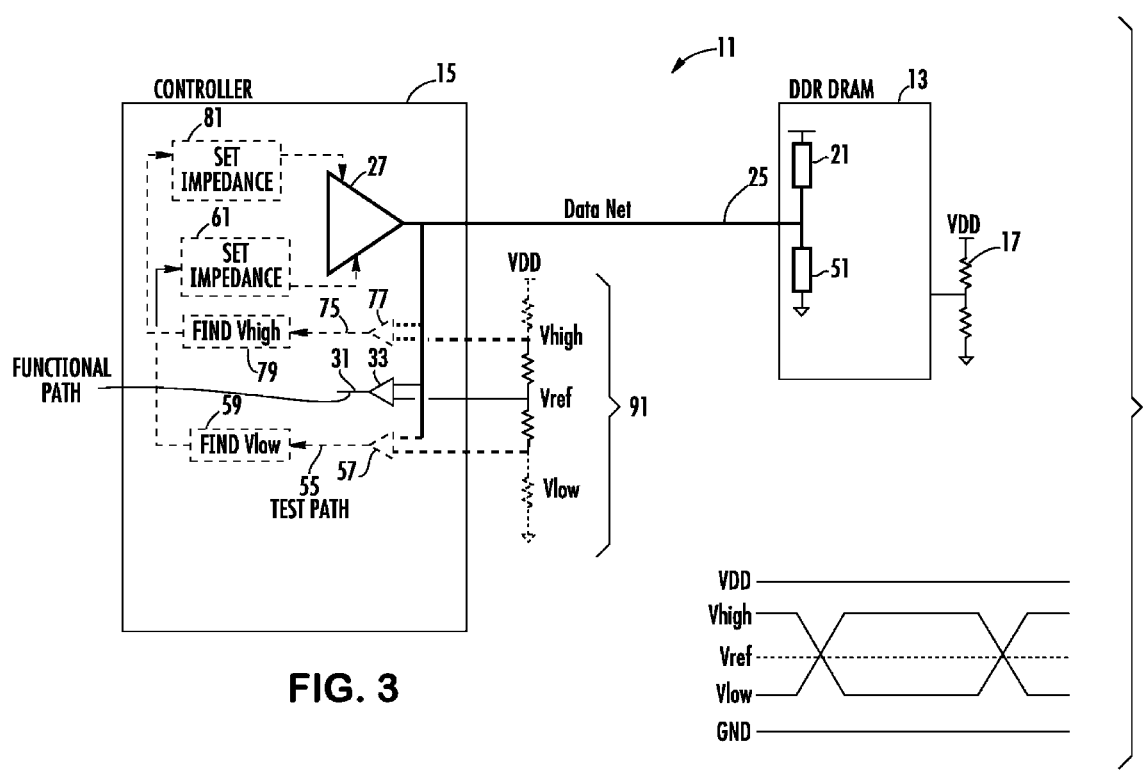
FIG. 3 is a schematic diagram of another embodiment of the invention for coupling a memory device and memory controller during driver training to reduce mismatches.

FIG. 3 illustrates an alternative embodiment for a midpoint Vref electrical interface, or any other interface where the high (Vhigh) and low (Vlow) values are not completely at one power supply rail or ground. More specifically, two test paths 55 and 75 with respective comparators 57 and 77 are provided. A network of 4 resistors 91 provides predetermined "0" level voltage to comparator 57, predetermined level "1" voltage to comparator 77, and a predetermined reference voltage to comparator 33. The memory device 13 includes two termination devices 21 and 51. Two detectors 59 and 79 are provided for each of the respective test paths, along with impedance setting devices 61 and 81.

In this embodiment, a 0 bit level voltage may first be written to the data net 25 and the controller driver 27 impedance may be set in a manner similar to what was previously described. After the controller driver 27 impedance for a 0 bit level is set, then a 1 bit level voltage is written on the net and the process proceeds in a manner similar for the 0 bit level.

Figure 5:
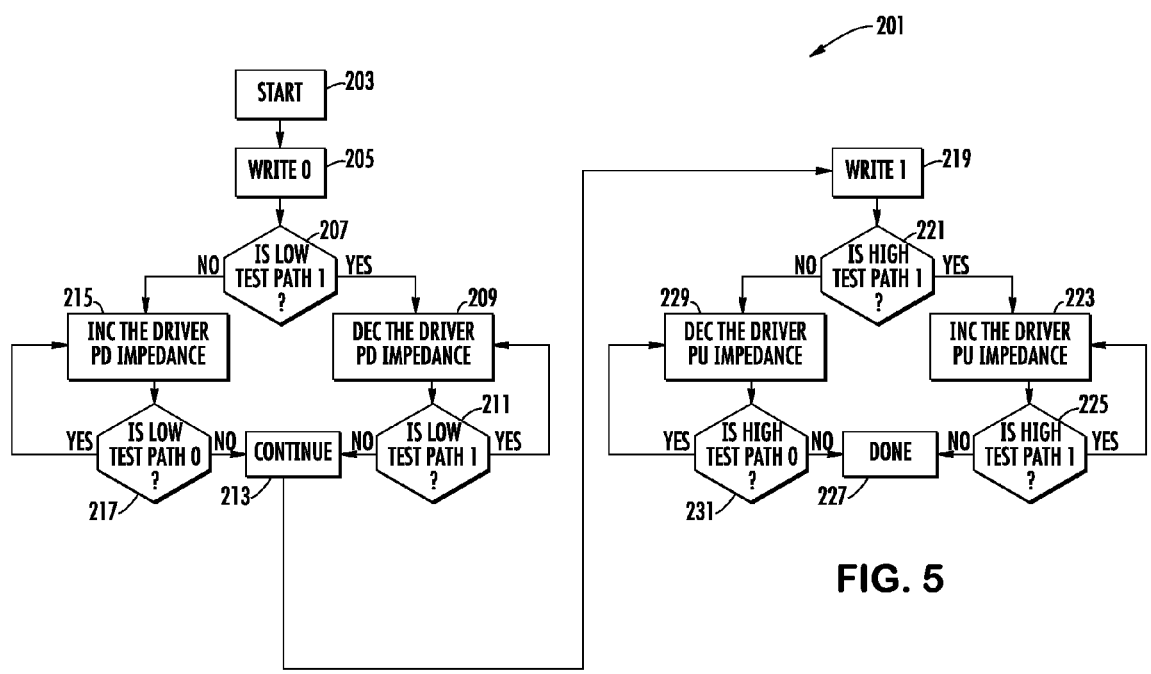
FIG. 5 is a flow diagram illustrating the operation during matching of the memory controller and the memory device of FIG. 3.

Flow chart 201 of FIG. 5 illustrates in greater detail the operation of the device of FIG. 3. As in the case with the operation of the device of FIG. 2, the process initiates at step 203 to find Vlow. A 0 bit level voltage is written at step 205 to the data net. The low test path may be tested at step 207 to determine if it is at a 1 bit level (i.e., the impedance may be too high). If so, the driver impedance may be decremented at step 209. The low test path is again tested at step 211 and the driver impedance may be continually decremented at step 209 until the low test path is no longer at a 1 bit level at which point the termination impedance for Vlow may be set and the process continues at step 213 to find the Vhigh value.

On the left side of the flow chart, if the low test path has been previously determined at step 207 to not be at a 1 bit level, then the impedance is considered to be too low and the driver impedance may be incremented at step 215. The low test path may be again tested at step 217. The driver impedance may continually be incremented until it is no longer at a 0 bit level. The process may continue at step 213 to find the Vhigh value.

For the Vhigh setting, a 1 bit level voltage is written at step 219 on the data net. If it is determined at step 221 that the test path is at a 1 bit level, which indicates that the impedance may be too low, the driver impedance may be incremented at step 223 and the test path may be again tested at step 225. The impedance may be continuously incremented until the test path is no longer at a 1 bit level. At that time, the process ends at step 227. If the high test path is not at a 1 bit level, this indicates the impedance may be too high. The driver impedance may be decremented at step 229. The test path may again be tested at step 231. The driver impedance continues to be decremented at step 229 until the test path is no longer at a 0 bit level, at which time the process terminates at step 227.

It should be appreciated by those of ordinary skill in the art that other application variables play a role in the optimal training of the interface relative to the appropriate Vhigh, Vlow and Vref values, or driver impedance strengths that determine the levels. Specifically, driver impedance or termination values may vary with temperature and/or voltage level variations associated with activity on other system or subsystem resources. Calibration for many of these methods may be repeated as conditions change for maintenance of optimal settings. Unique settings may be saved for different conditions if desired. For example, a temperature change of greater than 20 degrees centigrade (or some other present value) from the original or last calibration may occur. This change may initiate a new calibration or cause the loading of an alternate set of previously stored calibration values associated with the new temperature. This process may be done for variations that are associated with the activation or deactivation of other system resources that in some way impacts the performance or interface described.

While the present invention has been illustrated by a description of various embodiments and while these embodiments have been described in considerable detail, it is not the intention of the Applicants to restrict, or in any way limit, the scope of the appended claims to such detail. The invention in its broader aspects is therefore not limited to the specific details, representative apparatus and method, and illustrative example shown and described. Accordingly, departures may be made from such details without departing for the spirit or scope of Applicants general inventive concept.

What is claimed is:

1. A method of setting a memory controller driver in an electrical communication bus having a memory controller with a driver connected to a memory device, comprising:
   connecting a memory device in an electrical communication bus with a corresponding memory controller during training of a drive impedance of a driver of the memory controller;
   initializing a driver in the memory controller to write a first voltage on the communication bus as a 0 bit level to be read by the memory controller, said "0" bit level based on the memory controller's driver impedance value;
   setting a first voltage on a first test path of the memory controller at the 0 bit level first voltage on the electrical communication bus, adjusting and monitoring the first voltage on the test path; and
   when the voltage on the first test path switches its value, setting the driver impedance of the controller driver based on the switched first voltage on the first test path.

2. The method of claim 1, wherein said memory device is a Graphics Double Data 3 Rate (GDDR3) memory device.

3. The method of claim 1, wherein a reference voltage for a functional path of the memory controller is set at 0.7 VDD and the 0 bit level voltage on the test path of the memory controller is set at 0.4 VDD as the switched first voltage.

4. The method of claim 1, further comprising setting a first reference value voltage at a reference resistor arrangement connected to the memory controller at a functional path, setting the first voltage from the communication bus at the test path of the memory controller, adjusting the voltage on the test path until it switches in value, and setting the impedance for the driver of the memory controller based on the switched value.

5. The method of claim 1, wherein a termination device of said memory device and the driver of said controller are connected to said test path of said controller during adjustment of said 0 bit level voltage.

6. The method of claim 1, wherein said memory device has a reference voltage applied thereto during driver training.

7. The method of claim 1, further comprising:
   initiating the driver in the memory controller to write a second voltage on the communication bus as a 1 bit level to be read by the memory controller based on the memory device's termination value;
   setting a second voltage on a second test path of the memory controller at the 1 bit level second voltage on the electrical communication bus;
   adjusting and monitoring the second voltage on the test path; and
   when the voltage on the test path switches its value, setting the driver impedance value for the controller driver based on the switched second voltage on the second test path.

8. The method of claim 1, wherein said memory controller driver has a termination device connected thereto.

9. The method of claim 1, wherein said first voltage set by the controller driver is determined by setting a low voltage driver impedance value for the controller driver.

10. The method of claim 1, wherein said second voltage set by the controller driver is determined by setting a high voltage driver impedance value for the controller driver.

11. A coupled memory controller and memory device in an electrical communication bus, comprising;
   a connection comprising a data net between a memory interface of the memory controller to the memory device, connecting a driver of the memory controller to a termination of the memory device for initializing a virtual 0 bit level voltage on the data net;
   a test path in the memory controller connected for having the initial 0 bit level voltage from the data net applied thereto and adapted for changing a voltage thereon;
   the memory controller programmed for causing a voltage on the test path to change to a predetermined level causing said 0 bit level voltage to change;
   a detector for detecting a change in voltage connected on said test path; and
   a driver impedance setting module for setting the driver impedance at the memory controller driver.

12. The system of claim 11, wherein said memory device is a Double Data Rate 3 (GDDR3) dynamic random access memory (DRAM).

13. The system of claim 11, further comprising a detector on the test path to detect a voltage thereon.

14. The system of claim 11, wherein said data net is connected to the test path in the memory controller.

15. The system of claim 14, further comprising a resistor arrangement connected for applying a voltage to the test path.

16. A coupled memory controller and memory device in an electrical communication bus, comprising:
   a first connection comprising a data net between a memory interface of the memory controller to the memory device, connecting a driver of the memory controller to a first termination of the memory device for initializing an initial 0 bit level voltage on the data net, and connected to a second termination of the memory device for initializing an initial 1 bit level voltage on the data net;
   a first test path in the memory controller connector for having the initial 0 bit level voltage from the data net applied thereto and adapted for changing a first voltage applied thereon;
   the memory controller programmed for causing a voltage on the first test path to change to a first predetermined level causing said 0 bit level voltage to change;
   a first detector for detecting a change in voltage connected on said first test path;
   a first driver impedance setting module for setting the driver impedance at the memory controller driver;
   a second test path in the memory controller connected for having the initial 1 bit level voltage from the data net applied thereto and adapted for changing a second voltage applied thereon;

the controller further programmed for causing a voltage on the second test path to change to a second predetermined level causing said 1 bit level voltage to change;

a second detector for detecting a change in voltage connected on said second test path; and a second driver impedance setting module for setting the driver impedance at the memory controller driver.

17. The system of claim 16, wherein said memory device is a Double Data Rate 3 (GDDR3) dynamic random access memory (DRAM).

18. The system of claim 16, further comprising corresponding first and second detectors for detecting the voltages on the first and second test paths.

19. The system of claim 16, wherein said data net is connected to the first and second test paths in the memory controller.

20. The system of claim 19, further comprising a resistor arrangement connected for applying respective voltages to the first test path and to the second test path.

* * * * *